US008287368B2

(12) United States Patent
Trobia

(10) Patent No.: US 8,287,368 B2
(45) Date of Patent: Oct. 16, 2012

(54) WAGERING GAME WITH DIAGNOSTIC GRAPHICAL USER INTERFACE

(75) Inventor: Andrew G. Trobia, Des Plaines, IL (US)

(73) Assignee: WMS Gaming Inc., Waukegan, IL (US)

( * ) Notice: Subject to any disclaimer, the term of this patent is extended or adjusted under 35 U.S.C. 154(b) by 1296 days.

(21) Appl. No.: 11/277,063

(22) Filed: Mar. 21, 2006

(65) Prior Publication Data

US 2006/0264253 A1 Nov. 23, 2006

Related U.S. Application Data

(60) Provisional application No. 60/663,836, filed on Mar. 21, 2005.

(51) Int. Cl.
*G01R 31/00* (2006.01)
*A63F 7/30* (2006.01)
*G06F 11/00* (2006.01)
*G06F 3/00* (2006.01)
*G01R 31/28* (2006.01)

(52) U.S. Cl. ................ 463/31; 463/16; 463/25; 463/26; 463/28; 714/26; 714/712; 702/117; 702/119; 364/489

(58) Field of Classification Search .................... 463/30, 463/31, 25, 26, 16, 28; 702/117, 119; 714/26, 714/712; 364/489; 324/754.22
See application file for complete search history.

(56) References Cited

U.S. PATENT DOCUMENTS 4,709,366 A * 11/1987 Scott et al. ...................... 714/46
4,791,356 A * 12/1988 Warren et al. ................ 324/73.1
5,157,668 A * 10/1992 Buenzli et al. .................. 714/26
5,640,098 A * 6/1997 Niijima et al. ........... 324/754.22
5,836,819 A * 11/1998 Ugawa ............................ 463/30
6,438,973 B1 * 8/2002 Yoshida et al. ................. 62/126
2002/0138184 A1 * 9/2002 Kipersztok et al. ............. 701/29
2004/0072611 A1 * 4/2004 Wolf et al. ...................... 463/20
2004/0140617 A1 7/2004 Cordell
2005/0164788 A1 * 7/2005 Grabiec .......................... 463/35
2005/0209808 A1 * 9/2005 Kelbon et al. ................ 702/117
2008/0200245 A1 8/2008 Trobia

FOREIGN PATENT DOCUMENTS

WO WO-9820949 A1 5/1998
WO WO-2006039322 A2 4/2006
WO WO-2006039322 A3 4/2006

OTHER PUBLICATIONS

"U.S. Appl. No. 11/576,391, Examiner Interview Summary Jun. 24, 2011", 3 pgs.
"U.S. Appl. No. 11/576,391, Examiner Interview Summary mailed Jun. 29, 2011", 3 pgs.

(Continued)

*Primary Examiner* — Melba Bumgarner
*Assistant Examiner* — Frank M Leiva
(74) *Attorney, Agent, or Firm* — Schwegman Lundberg & Woessner, P.A.

(57) ABSTRACT

A computerized wagering game system includes a gaming module comprising a processor and gaming code which is operable when executed on the processor to conduct a wagering game on which monetary value can be wagered, and a service module. The service module is operable to electronically provide service documentation to a wagering game service technician via a user interface of the computerized wagering game system.

21 Claims, 4 Drawing Sheets

OTHER PUBLICATIONS

"U.S. Appl. No. 11/576,391, Examiner Interview Summary Mailed Dec. 15, 2011", 3 pgs.
"U.S. Appl. No. 11/576,391, Examiner Interview Summary mailed Jun. 24, 2011", 3 pgs.
"U.S. Appl. No. 11/576,391, Final Office Action mailed Sep. 16, 2011", 10 pgs.
"U.S. Appl. No. 11/576,391, Non Final Office Action mailed Mar. 28, 2011", 9 pgs.
"U.S. Appl. No. 11/576,391, Preliminary Amendment filed Mar. 30, 2007", 3 pgs.
"U.S. Appl. No. 11/576,391, Response filed Mar. 3, 2011 to Restriction Requirement mailed Jan. 3, 2011", 9 pgs.
"U.S. Appl. No. 11/576,391, Response filed Jun. 28, 2011 to Non Final Office Action mailed Mar. 28, 2011", 9 pgs.
"U.S. Appl. No. 11/576,391, Restriction Requirement mailed Jan. 3, 2011", 7 pgs.
"U.S. Appl. No. 11/576,391 Response Filed Dec. 16, 2011 to Final Office Action mailed Sep. 16, 2011", 14 pgs.

* cited by examiner

WAGERING GAME WITH DIAGNOSTIC GRAPHICAL USER INTERFACE

RELATED APPLICATION

This application claims priority under 35 U.S.C. 119(e) from U.S. Provisional Application Ser. No. 60/663,836 filed Mar. 21, 2005, which application is incorporated herein by reference.

FIELD OF THE INVENTION

The invention relates generally to computerized wagering game machines, and more specifically a diagnostic graphical user interface in computerized wagering game machines.

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever. Copyright 2006, WMS Gaming, Inc.

BACKGROUND

Traditional mechanical wagering game machines such as slot machines have largely been replaced by computerized electronic wagering game systems, which are also rapidly being adopted to implement computerized versions of games that are traditionally played live such as poker and blackjack. These computerized games provide many benefits to the game owner and to the gambler, including greater reliability than can be achieved with a mechanical game or human dealer, more variety, sound, and animation in presentation of a game, and a lower overall cost of production and management.

The elements of computerized wagering game systems are in many ways the same as the elements in the mechanical and table game counterparts in that they should be fair, they should provide sufficient feedback to the game player to make the game fun to play, and they should meet a variety of gaming regulations to ensure that both the machine owner and gamer are honest and fairly treated in implementing the game. Further, they must provide a gaming experience that is at least as attractive as the older mechanical gaming machine experience to the gamer, to ensure success in a competitive gaming market.

Computerized wagering games do not rely on the dealer or other game players to facilitate game play and to provide an entertaining game playing environment, but rely upon the presentation of the game and environment generated by the wagering game machine itself. Incorporation of audio and video features into wagering games to present the wagering game, to provide guidance or direction to the game player, and to enhance the environment presented are therefore important elements in the attractiveness and commercial success of a computerized wagering game system. It is not uncommon for audio voices to provide instruction and help, and to provide commentary on the wagering game being played. Music and environmental effects are also played through speakers in some wagering game systems to enhance or complement a theme of the wagering game. These sounds typically accompany video presentation of the wagering game on a screen, which itself often includes animation, video, and three-dimensional graphics as part of presentation of the wagering game.

But, such wagering games are complex systems that can be significantly more difficult to troubleshoot and repair than traditional mechanical wagering game machines. A variety of resources are usually available, including schematics and service manuals designed to guide a service technician through troubleshooting various malfunctions, but identifying and troubleshooting suspect components can vary from machine to machine as different configurations and options are used from one wagering game system to another.

The differences between machines and configurations can add complexity to the troubleshooting process for even the most experienced technician, and in some situations can cause the technician to believe that a certain system is the same as another he is familiar with when significant differences exist, such as circuit board revisions or changes in software.

It is therefore desired to have better guidance in troubleshooting problems with computerized wagering game machines.

SUMMARY

One example embodiment of the invention comprises a computerized wagering game system including a gaming module comprising a processor and gaming code which is operable when executed on the processor to conduct a wagering game on which monetary value can be wagered, and a service module. The service module is operable to electronically provide service documentation to a wagering game service technician via a user interface of the computerized wagering game system.

In a further example embodiment, the service documentation comprises at least one of circuit board component labels and circuit board component terminal labels for at least one circuit within the wagering game system, and the service documentation further comprises a state of at least one of the circuit board components or circuit board component terminals. In another embodiment, the service documentation comprises service documentation customized to the configuration of the specific wagering game system, and is operable to walk a service technician through troubleshooting steps tailored to the specific wagering game system's configuration.

DETAILED DESCRIPTION

In the following detailed description of example embodiments of the invention, reference is made to specific examples by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit the invention as a whole, and any reference to the invention, its elements, operation, and application do not limit the invention as a whole but serve only to define these example embodiments. The following detailed description does not, therefore, limit the scope of the invention, which is defined only by the appended claims.

Examples of the present invention presented here seek to provide better guidance in troubleshooting problems within a computerized wagering game machine by implementation of a service module within the wagering game system. The service module comprises hardware, software, and various combinations thereof in various embodiments of the invention, and serves to electronically provide service documentation to a wagering game service technician via a user interface of the computerized wagering game system.

The service documentation in some further embodiments of the invention comprises at least one of circuit board component labels and circuit board component terminal labels for a circuit or circuits within the wagering game system. The service documentation further comprises a state of at least one of the circuit board components or circuit board component terminals. In another embodiment, the service documentation comprises service documentation customized to the configuration of the specific wagering game system, and is operable to walk a service technician through troubleshooting steps tailored to the specific wagering game system's configuration.

Figure 1:
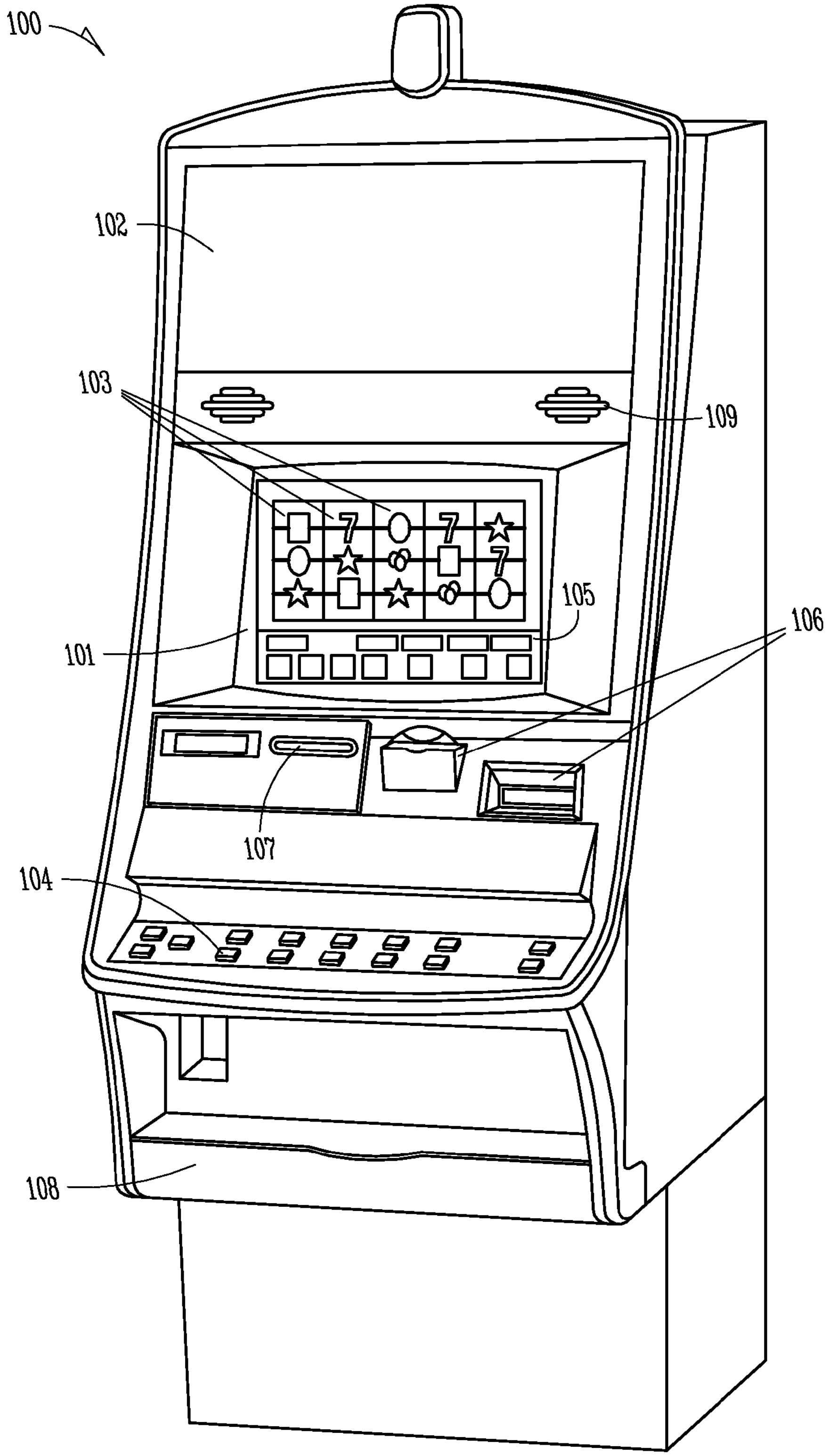
FIG. 1 shows a computerized wagering game machine, as may be used to practice some example embodiments of the present invention.

FIG. 1 illustrates a computerized wagering game machine, as may be used to practice some embodiments of the present invention. The computerized gaming system shown generally at 100 is a video wagering game system, which displays information for at least one wagering game upon which monetary value can be wagered on video display 101. Video display 101 is in various embodiments a CRT display, a plasma display, an LCD display, a surface conducting electron emitter display, or any other type of display suitable for displaying electronically provided display information. In some further embodiments, additional displays such as a bonus game display or top box display 102 are further operable to display electronically provided information to a wagering game player. Alternate embodiments of the invention will have other game indicators, such as mechanical reels instead of the video graphics reels shown at 103 that comprise a part of a video slot machine wagering game.

A wagering game is implemented using software within the wagering game, such as through instructions stored on a machine-readable medium such as a hard disk drive or nonvolatile memory. In some further example embodiments, some or all of the software stored in the wagering game machine is encrypted or is verified using a hash algorithm or encryption algorithm to ensure its authenticity and to verify that it has not been altered. For example, in one embodiment the wagering game software is loaded from nonvolatile memory in a compact flash card, and a hash value is calculated or a digital signature is derived to confirm that the data stored on the compact flash card has not been altered. The wagering game implemented via the loaded software takes various forms in different wagering game machines, including such well-known wagering games as reel slots, video poker, blackjack, craps, roulette, or hold 'em games. In some further embodiments, a secondary game or bonus game is displayed on the secondary display 102, or other information such as progressive slot information or other community game information is displayed.

The wagering game is played and controlled with inputs such as various buttons 104 or via a touchscreen overlay to video screen 101. The touchscreen is used in some embodiments to display virtual buttons, which can have unique functions in some embodiments, or can duplicate the functions provided by the mechanical buttons 104 in other embodiments. In some alternate examples, other devices such as virtual buttons 105 on the touchscreen display or a pull arm are employed to provide other input interfaces to the game player, such as to initiate reel spin. The player interface components are in this example contained within or mechanically coupled to the wagering game system, but in other embodiments will be located outside the wagering game system cabinet such as by a wired or wireless electronic connection to the wagering game system.

Monetary value is typically wagered on the outcome of the games, such as with tokens, coins, bills, or cards that hold monetary value. The wagered value is conveyed to the machine such as through a changer 106 or a secure user identification module interface 107, and winnings are returned such as via a returned value ticket, a stored value card, or through the coin tray 108. Sound is also provided through speakers 109, typically including audio indicators of game play, such as reel spins, credit bang-ups, and environmental or other sound effects or music to provide entertainment consistent with a theme of the computerized wagering game. In some further embodiments, the wagering game machine is coupled to a network, and is operable to use its network connection to receive wagering game data, track players and monetary value associated with a player, and to perform other such functions.

The speakers 109 and the display 101 are used in one example embodiment of the invention to provide information to a service technician to allow the technician to diagnose and repair a malfunctioning wagering game machine. Diagnosis and repair often comprises identification and replacement of an electrical, mechanical, or electromechanical component of the wagering game system, such as replacement of an electronic component on a printed circuit board or an electromechanical device such as a dollar bill changer or a button.

The failed part is typically identified by direct observation of the malfunction in simple cases, or by application of a troubleshooting method such as performing diagnostic steps indicated in a service manual for more complex cases. Traditional service documentation includes a service manual including a paper copy of a schematic of the system under service, and a number of test points and expected signal levels or functions observable to confirm proper operation of various components of the system.

Service manuals as such are useful only when the wagering game system that is malfunctioning is identical in configuration, component revision, and other specifications to the system to which the service manual is directed. Further, it is not a certainty that the service technician will perform the diagnostic procedures in the intended order, which may complicate or delay correct diagnosis and repair of the malfunctioning system.

Figure 2:
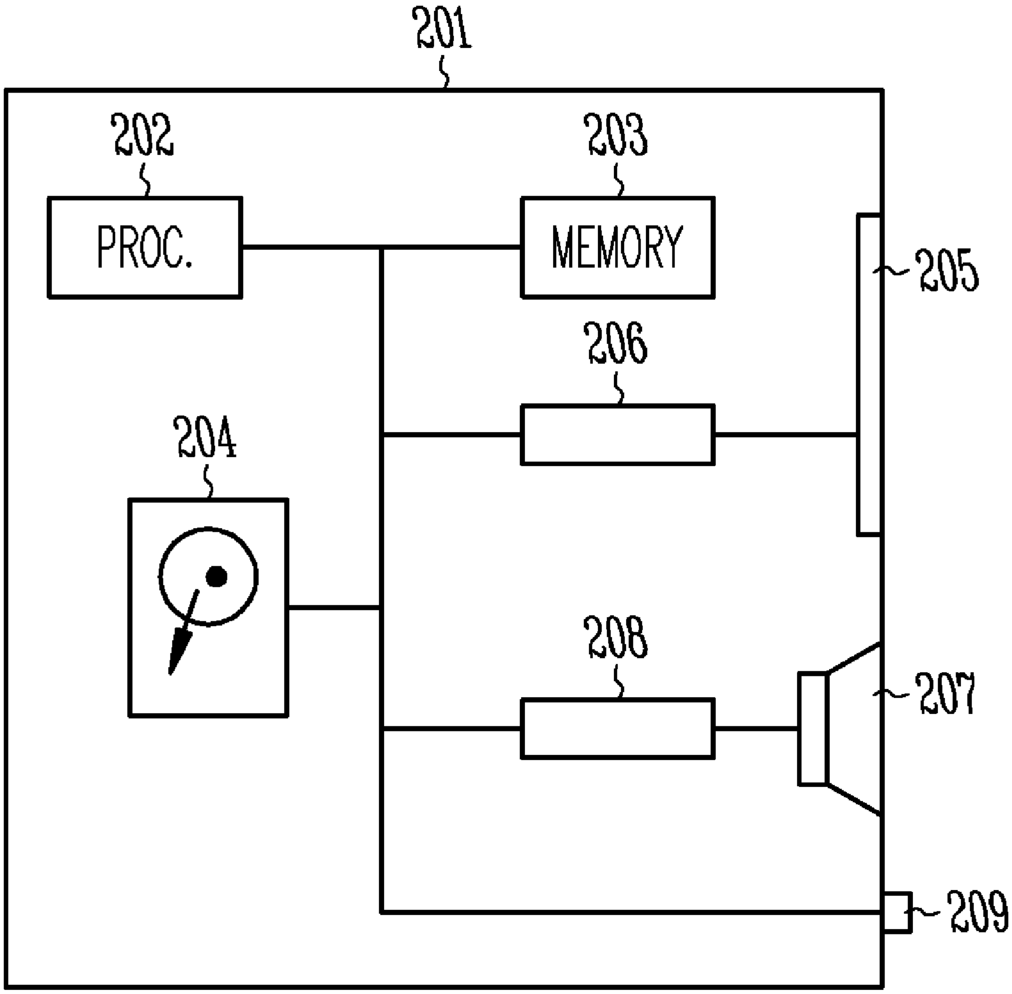
FIG. 2 shows a block diagram of a computerized wagering game system having a service module, consistent with some example embodiments of the present invention.

FIG. 2 shows a block diagram of a system having a service module operable to electronically provide service information to a wagering game service technician. The service module comprises in various embodiments hardware, software, or a combination thereof. The service module communicates with the service technician through a user interface, such as through the screen 101 or speakers 108 of FIG. 1, or through another user interface.

The computerized wagering game system 201 has a processor 202 and memory 203. It also has nonvolatile storage, such as hard disk drive 204, or nonvolatile memory such as a compact flash card or flash memory. A touchscreen display or other video display 205 is coupled to the processor by a video controller 206, and a speaker 207 is coupled to the system via an audio controller 208. Other inputs and outputs, such as user button 209, are also found in various further embodiments.

In operation, the processor loads program data from nonvolatile storage such as hard disk drive 204, and loads it into memory 203. The program code is then executed, such as to conduct a computerized wagering game upon which monetary value can be wagered, or to conduct service module operations. The service module operates in one embodiment as software executing on the processor 202 from memory 203 after being loaded from nonvolatile storage 204, under the control of the user via inputs such as touchscreen 205 or buttons 209. The service module provides feedback to the service technician or other user via the touchscreen display 205, speaker 207, or other such user interfaces.

Figure 3:
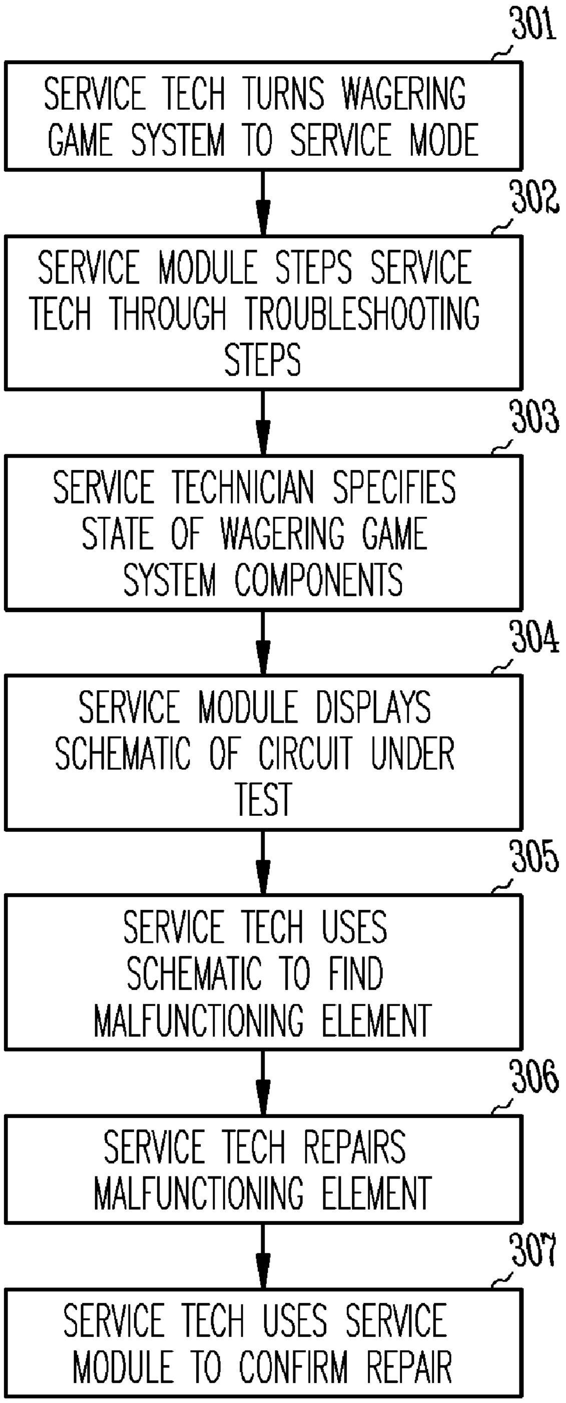
FIG. 3 is flowchart showing a method of providing service data to a service technician in a computerized wagering game machine, consistent with some example embodiments of the present invention.

FIG. 3 is a flowchart, showing an example method of operation of a service module to diagnose and confirm repair of a malfunctioning element of the computerized wagering game system. After a fault or problem with a particular wagering game system is suspected, a service technician is notified and places the wagering game system in a service mode at 301. The machine is placed in service mode by various methods in different embodiments, such as by turning a service mode key to a service position, by activating a switch inside the cabinet of the wagering game system, or by identification of a service technician by use of a smart card or other identifier.

At 302, the service mode steps the service technician through troubleshooting, repair, and verification to identify and fix the wagering game system's malfunctioning component. Typically, the service technician will have information relating to the malfunction that will enable rapid identification of the general nature of the components that are suspect. For example, if a wagering game system fails to respond to a certain button, the button and the electronics coupled to the button are suspected. If a card reader fails to load or return a card, the card reader or the electronics coupled to the card reader are suspected.

Figure 5:
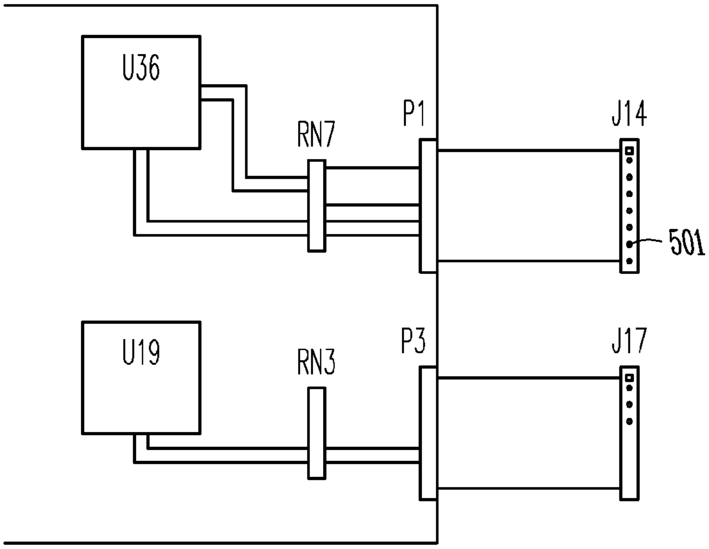
FIG. 5 is a schematic of a computerized wagering game system as provided by a service module, consistent with an example embodiment of the present invention.

Based on this knowledge, the service technician can exercise or test certain components to confirm their operation via the service module. At 303, the service technician specifies a state of one or more wagering game system components, as part of the diagnostic process. For example, if a coin hopper is failing to dispense coins, the service technician may elect to selectively turn the state of the coin hopper to dispense, to observe whether the machine operates properly in that state. If a malfunction is confirmed, such as by the coin hopper failing to dispense a coin or token when directed to do so, the service module displays a schematic of the circuit under test at 304. Such a schematic is shown in FIG. 5, and serves to illustrate in later examples how a schematic can be used in conjunction with other information presented via the service module do diagnose and fix a malfunction.

The schematic is specific to the configuration and revision level of the particular machine being used, so is significantly more likely to be directly relevant to the malfunctioning machine than a generic service manual or other service material not customized and kept up-to-date to reflect the status of the particular wagering game machine. The service module is further not removable from the wagering game system in ordinary use, so the chances of its being unavailable are much lower than the chances of a paper service manual associated with a particular machine being unavailable when service is needed.

Figure 4:
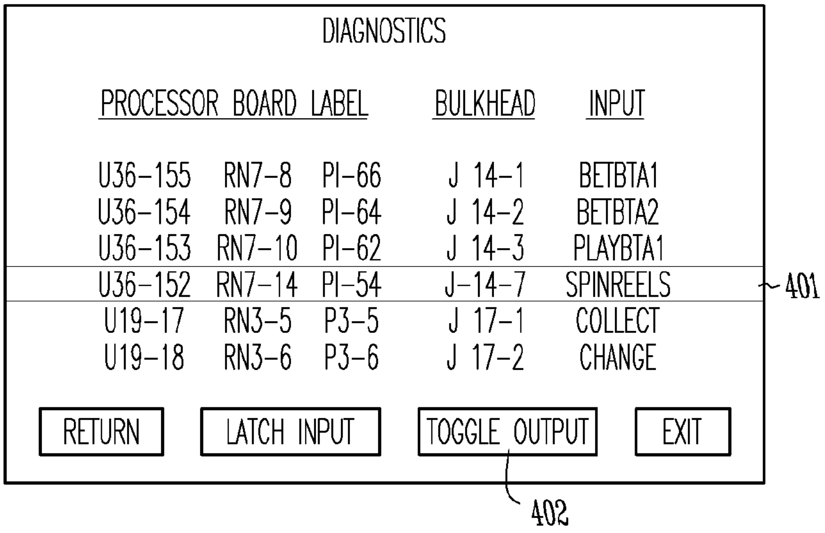
FIG. 4 is a screen image of a computerized wagering game service system, consistent with some example embodiments of the present invention.

At 305, the service technician uses the schematic, along with other diagnostic information such as a diagnostics state screen as is shown in FIG. 4 and as may be used to specify the state of various wagering game system components at 303, to identify the various components that may be causing the malfunction. The schematic shows the interconnection of various elements of the circuit, and along with the diagnostic screen of FIG. 4, suggests what components are in the signal path of the malfunctioning device. Signals going into and coming out of the various components can be checked as the states of various wagering game system components are varied, enabling the service technician to identify one or more components as possibly malfunctioning, and as possible candidates for replacement At 306, the service technician replaces the malfunctioning elements or components. This is typically done with the wagering game system power turned off, so work on the wagering game system components doesn't cause further damage or unintended operation or malfunctioning of other elements of the wagering game system. Once the suspected failed components are replaced, the service technician uses the service module to exercise or operate the previously malfunctioning components of the wagering game system to confirm that the repair was successful at 307.

FIG. 4 illustrates a diagnostics screen, consistent with an example embodiment of the present invention. The diagnostics screen is use din conjunction with the screen of FIG. 5, which is a board diagram schematic of the circuit under repair. The diagnostics screen lists a variety of inputs and outputs coupled to the wagering game system's circuitry, such as various lights, coin hoppers, card readers, buttons, displays, speakers, and other such components. The screen of FIG. 4 shows several example input signals, including the highlighted "spin reels" input at 401.

If the reels in a computer-controlled reel slot machine failed to spin, the serviced technician would select the spinreels input at 401, and toggle the state of the spinreels signal using the toggle output button at 402. If the reels failed to spin when the spinreels output was toggled on, the service technician would use the bulkhead and processor board label data to track the signal through the circuit board to the reels to observe the state of various components in the spinreels signal's path.

Referring now to the circuit board schematic of FIG. 5 and to the spinreels line 401 of FIG. 4, we can observe that the reels are connected to the circuit board via bulkhead connection J14, pin 7. The service technician can then check the signal at connector J14, pin 7, to observe the state of the signal as the spinreels signal state is toggled using the diagnostics display of FIG. 4. If the signal changes as expected, the reels appear to be at fault and are replaced. If the signal fails to change, the signal path can be traced back through the circuit, using the other information for the spinreels signal in FIG. 4.

The printed circuit board connector PI, pin 54, is noted in FIG. 4 as the next signal point, and so the service technician would likely continue diagnosing the malfunction there. If the signal is good at P54 but bad at J14, the cable connecting P1 to J14 is suspected and replaced. If both signals are bad, further diagnostics are performed as the signal is traced back through resistor network RN7, pin 14, and integrated circuit U36, pin 152. Once the suspected failed component is identified, it is replaced, and the same tools such as the diagnostics screen of FIG. 4 and the circuit diagram of FIG. 5 are used to confirm proper operation.

Because components of the service module such as the diagnostics screen of FIG. 4 and the circuit board schematic diagram of FIG. 5 are revised whenever the circuit boards or other components of a wagering game system are revised, they are constantly up-to-date, and always present in the specific wagering game system to which they are tailored. This allows the service technician to more efficiently service a malfunctioning wagering game with such a service module, because the service information won't be removed as is often the case with paper documentation, and won't be out of date or inappropriate for a specific revision or model of the machine.

Such a service module therefore also reduces the maintenance cost, and provides an image of a well-conceived, easily serviceable wagering game system that is attractive to potential wagering game system owners such as casinos and other gaming establishments.

These examples illustrate how a service module can be employed in a computerized wagering game system to better provide service information to technicians and other service personnel. The embodiments presented here show how electronically provided service documentation can have several advantages over traditional paper documentation, including easy updates and version tracking, easy association and retention within specific wagering game machines, and reduced cost of service. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A computerized wagering game system, comprising:

a gaming module comprising a processor and gaming code which is operable when executed on the processor to present a wagering game on which monetary value can be wagered; and a service module operable to:

receive a command to test a component of the wagering game system;

upon confirming that the component of the wagering game system failed the test, electronically present via a user interface of the computerized wagering game system, a schematic representation of a circuit board including a portion of an electronic circuit of the component under test, wherein the schematic representation is specific to a configuration and revision level of the computerized wagering game system, and wherein the circuit board is installed in the computerized wagering game system; and present a diagnostic screen concurrent with presenting the schematic representation, the diagnostic screen configured to display a plurality of inputs and outputs coupled to the circuit board of the computerized wagering game system.

2. The computerized wagering game system of claim 1, wherein the service module is further operable to present service documentation comprising at least one of circuit board component labels and circuit board component terminal labels for at least one circuit within the wagering game system.

3. The computerized wagering game system of claim 2, wherein the service documentation comprises a state of at least one of circuit board components or circuit board component terminals.

4. The computerized wagering game system of claim 1, wherein the user interface comprises at least one of a video display and a speaker.

5. The computerized wagering game system of claim 1, wherein the service module is further operable to allow a user to specify via the user interface the state of at least one output of a circuit within the wagering game system.

6. The computerized wagering game system of claim 1, wherein the service module is further operable to provide service documentation stepping the user through troubleshooting steps.

7. The computerized wagering game system of claim 1, wherein the service module is further operable to present a state of the electronic circuit in a tabular format.

8. The computerized wagering game system of claim 1, wherein the schematic representation of the electronic circuit comprises a path between at least two circuit board components selected from: a bulkhead connection, a resistor, and an integrated circuit.

9. A method of providing service information in a computerized wagering game system, comprising:

receiving a command to test a component of the wagering game system;

upon confirming that the component of the wagering game system failed the test, presenting on a display device of the computerized wagering game system, a schematic representation of a circuit board including a portion of an electronic circuit of the component under test, wherein the schematic representation is specific to a configuration and revision level of the computerized wagering game system, and wherein the circuit board is installed in the computerized wagering game system; and presenting a diagnostic screen concurrent with presenting the schematic representation, the diagnostic screen configured to display a plurality of inputs and outputs coupled to the circuit board of the computerized wagering game system.

10. The method of claim 9, further comprising presenting service documentation comprising at least one of circuit board component labels and circuit board component terminal labels for at least one circuit within the wagering game system.

11. The method of claim 10, wherein the service documentation comprises a state of at least one of circuit board components or circuit board component terminals.

12. The method of claim 9, further comprising stepping a user through troubleshooting steps.

13. The method of claim 9, further comprising providing a user the ability to specify via the user interface the state of at least one output of a circuit within the wagering game system.

14. The method of claim 9, further comprising presenting a state of the electronic circuit in a tabular format.

15. The method of claim 9, wherein the schematic representation of the electronic circuit comprises a path between at least two circuit board components selected from: a bulkhead connection, a resistor, and an integrated circuit.

16. A non-transitory machine-readable medium with instructions stored thereon, the instructions when executed operable to cause a computerized wagering game system to:

receive a command to test a component of the wagering game system;

upon confirming that the component of the wagering game system failed the test, present on a display device of the computerized wagering game system, a schematic representation of a circuit board including a portion of an electronic circuit of the component under test, wherein the schematic representation is specific to a configuration and revision level of the computerized wagering game system, and wherein the circuit board is installed in the computerized wagering game system; and present a diagnostic screen concurrent with presenting the schematic representation, the diagnostic screen configured to display a plurality of inputs and outputs coupled to the circuit board of the computerized wagering game system.

17. The non-transitory machine-readable medium of claim 16, wherein the instructions when executed, cause the computerized wagering game system to present service documentation comprising at least one of circuit board component labels and circuit board component terminal labels for at least one circuit within the wagering game system, and wherein the service documentation further comprises a state of at least one of the circuit board components or circuit board component terminals.

18. The non-transitory machine-readable medium of claim 16, wherein the instructions when executed, cause the computerized wagering game system to step a user through troubleshooting steps.

19. The non-transitory machine-readable medium of claim 16, wherein the instructions when executed, cause the computerized wagering game system to provide a user the ability to specify via the user interface the state of at least one output of a circuit within the wagering game system.

20. The non-transitory machine-readable medium of claim 16, wherein the instructions when executed, cause the computerized wagering game system to present a state of the electronic circuit in a tabular format.

21. The non-transitory machine-readable medium of claim 16, wherein the schematic representation of the electronic circuit comprises a path between at least two circuit board components selected from: a bulkhead connection, a resistor, and an integrated circuit.

* * * * *